United States Patent [19]

Lin et al.

[11] Patent Number: 5,167,992
[45] Date of Patent: Dec. 1, 1992

[54] SELECTIVE ELECTROLESS PLATING PROCESS FOR METAL CONDUCTORS

[75] Inventors: Charles W. C. Lin; Ian Y. K. Yee, both of Austin, Tex.

[73] Assignee: Microelectronics and Computer Technology Corporation, Austin, Tex.

[21] Appl. No.: 667,778

[22] Filed: Mar. 11, 1991

[51] Int. Cl.$^5$ .............................. C23C 26/00
[52] U.S. Cl. ............................ 427/437; 427/306; 427/307; 427/98
[58] Field of Search ............... 427/437, 306, 307, 98

[56] References Cited

U.S. PATENT DOCUMENTS

| | | | |
|---|---|---|---|
| 3,443,988 | 5/1969 | McCormack et al. | 117/212 |
| 3,640,765 | 2/1972 | DiStefano et al. | 117/212 |
| 3,753,667 | 8/1973 | Metzger et al. | 29/195 |
| 3,821,016 | 6/1974 | De Angelo | 117/47 |
| 3,878,007 | 4/1975 | Feldstein et al. | 156/11 |
| 4,096,043 | 1/1978 | De Angelo | 304/15 |
| 4,151,313 | 4/1979 | Wajima et al. | 427/98 |
| 4,181,750 | 1/1980 | Beckenbaugh et al. | 430/414 |
| 4,232,060 | 11/1980 | Mallory, Jr. | 427/98 |
| 4,537,799 | 8/1985 | Dorey, II et al. | 427/259 |
| 4,568,562 | 2/1986 | Phillips | 427/40 |
| 4,600,609 | 7/1986 | Leever et al. | 427/438 |
| 4,717,439 | 1/1988 | Hajdu et al. | 156/280 |
| 4,718,972 | 1/1988 | Babu et al. | 156/628 |
| 4,770,899 | 9/1988 | Zeller | 427/96 |
| 4,810,332 | 3/1989 | Pan | 204/15 |
| 4,846,929 | 7/1989 | Bard | 427/307 |
| 4,851,081 | 7/1989 | Forschirm | 427/307 |
| 4,929,422 | 5/1990 | Mahlkow | 427/306 |
| 4,941,940 | 7/1990 | Patel | 427/307 |
| 4,981,715 | 1/1991 | Hirsch | 427/98 |
| 5,084,299 | 1/1992 | Hirsch | 427/98 |

OTHER PUBLICATIONS

Chen et al., "Stress Relaxation During Thermal Cycling in Metal/Polyimide Layered Films", Journal of Applied Physics, vol. 64, No. 12, Dec. 15, 1988, pp. 6690-6698.

Kowalczyk et al., "Polyimide on Copper: The Role of Solvent Formation of Copper Precipitates", Applied Physics Letter 52(5), Feb. 1, 1988, pp. 375-376.

White et al., "Cr- and Cu-Polyimide Interface: Chemistry and Structure", Applied Physics Letters 51(7), Aug. 17, 1987, pp. 481-483.

Webster's Seventh New Collegiate Dictionary, GRC, Merriam Company, 1963, pp. 187, 188, 285.

G. G. Hawley, "The Condensed Chemical Dictionary", 8th ed. Van Nostrand Reinhold Company, 1971, p. 451.

*Primary Examiner*—Shrive Beck
*Assistant Examiner*—Vi Duong Dang
*Attorney, Agent, or Firm*—David M. Sigmond

[57] ABSTRACT

A method for electrolessly plating an overcoat metal on a metal conductor disposed on a dielectric surface of a substrate. The method includes removing carbonized film from the dielectric surface by applying a plasma discharge, acid treating the metal conductor by dipping the substrate in a first acid solution in order to clean the surface of the metal conductor, activating the metal conductor to allow electroless plating thereon by dipping the substrate in a metal activator solution, deactivating the dielectric surface to prevent electroless plating thereon without deactivating the metal conductor by dipping the substrate in a second acid solution, and plating an overcoat metal on the metal conductor by dipping the substrate in an electroless plating solution so that the overcoat metal plates on and coats the metal conductor without plating on the dielectric surface.

44 Claims, No Drawings

SELECTIVE ELECTROLESS PLATING PROCESS FOR METAL CONDUCTORS

FIELD OF THE INVENTION

The invention relates to selective electroless plating of an overcoat metal on a conductor metal without plating on a dielectric surface of a substrate. It is useful in the process of making printed circuits and particularly useful for the manufacture of high resolution circuit boards and interconnect substrates.

BACKGROUND OF THE INVENTION

In the fabrication of microelectronic interconnect substrates which typically use copper as the electrical conductor, a protective overcoat is often required because copper tends to be corroded by many hostile chemicals. This undesired corrosion degrades adhesion of the materials as well as other properties. (Polyimide, which is often used as the dielectric material, may not only contain moisture which can corrode the copper, but also attract copper diffusion.) In the fabrication of mulitlayer copper/dielectric interconnect substrates, the copper needs to be protected against corrosion and/or diffusion with an overcoat material such as nickel, chromium, titanium, or brown copper oxide.

In the past, difficulty has been experienced in accurately depositing electroless metal (or metal alloys) on closely defined copper features on a dielectric surface. There is a tendency for dielectric material to become sensitized and receive deposits of metal. Such undesired deposition of metal can cause short circuits between the circuitry elements. This constitutes a serious limitation of fabrication processes.

Prior methods which employed selective overplating of copper conductors with electroless metals were not very effective. One major problem that causes non-selective plating is the trapping of metal ions, such as palladium (II), from the activation process. The small amount of trapped metal ions on the dielectric surface can be reduced when contacted with an electroless plating solution. Depending on the circuitry complexity, it can be extremely difficult to remove the trapped ions by water or alkaline solutions. Potentially, the copper structure on the dielectric surface may block the hydrodynamic force during the rinsing process. In most cases, even a spin rinse is not effective; especially in the dense areas of the surface. Ultrasonic rinsing definitely assists the removal of these trapped ions, but also removes the palladium metal particles deposited on the copper surface. This then causes that section of the copper surface to become non-catalytic and results in uneven electroless plating. Alternate approaches have included the use of a plasma discharge to make the polyimide surface hydrophobic before soaking in an activator solution so that the metal ions are not trapped. The results, though, have been very unpredictable due to the uneven wettability of the surface. In addition, this pretreatment greatly degrades the adhesion between polyimide layers necessitating a further plasma discharge to remove the hydrophobic surface and ensure good adhesion between the polyimide layers. This increases the complexity of the fabrication process.

Prior attempts to solve these problems have included the following:

U.S. Pat. No. 4,810,332, which issued to J.D. Pan on Mar. 7, 1989 describes the use of thin polyimide layers and a metal electroplating mask for electroplating nickel on copper pillars. The major problems associated with this process are (i) the metal being undercut during the interconnect stripping process; (ii) shorting across the metal traces because the polyimide layer is too thin; (iii) shorting across the metal trace because of cracks in the polyimide; (iv) failure of the metal to plate due to organic scum; and (v) the copper is only partially protected due to incomplete coverage by the overcoat metal.

U.S. Pat. No. 4,770,899, which issued to F. M. Zeller on Sep. 13, 1988. This procedure provides for dipping of a palladium chloride catalyst solution and then subsequent dipping in a hydroxide solution with subsequent electroless plating of a metal. However, the hydroxide solution is not an efficient deactivator of polyimide and may only delay or reduce the tendency to plate polyimide for a short time.

U.S. Pat. No. 4,717,439 issued to J. Hajdu, et al, on Jan. 5, 1988, describes a process for preparing a copper oxide coating on a copper circuit board for leach resistance. This, however, is an overcoat solution only for processes that do not require high curing temperatures. This process might be useful in protecting copper in a plastic lamination process, but is not likely to protect copper if high temperature polyimide curing is subsequently required.

U.S. Pat. No. 4,568,562 which issued to E. Phillips on Feb. 4, 1986, describes a process which uses a tetrafluoromethane plasma treatment to passivate or neutralize the plastic substrate surface area in an attempt to selectively overcoat by electroless nickel. Unfortunately, since the copper is hydrophilic while the dielectric is hydrophobic, some activation solution may be trapped around the copper and difficult to rinse. Any such trapped activation solution can cause non-uniform plating. Also, subsequent application of additional plastic coats for multilevel fabrication may be complicated by poor adhesion to the modified and fluorinated surface.

U.S. Pat. No. 4,718,972 which to S. Babu on Jan. 12, 1988 uses an oxygen/halocarbon treatment to remove seed particles on the substrate. Similar drawbacks to those discussed for the U.S. Pat. No. 4,568,562 may arise. Furthermore, these two patents only solve part of the problem. After a plastic surface is made non-conducting, nickel plating on the plastic surface between copper lines (i.e. sheeting) can be caused by incomplete removal of catalytic species, such as palladium ions, which are introduced on to the plastic surface during the activation process.

U.S. Pat. No. 4,537,799 which issued to J. Dorey, et al, on Aug. 27, 1985 describes a process using acetic acid for treating a substrate having a negative mask to achieve selective metallization. Selectivity is achieved since acetic acid can only be effective to dissolved and/or modified negative photoresist type materials but not to any other materials such as thermosetting resins, thermoplastic resins and mixtures thereof.

U.S. Pat. No. 4,151,313 which issued to M. Wajima, et al, on Apr. 24, 1979, describes a method of modifying the negative working mask materials with solid solutions of oxides of metals to that the initiator for the electroless plating on the mask can be completely removed. This method is only applicable to the processes where modified materials are not permanent dielectrics and do not affect the electrical and mechanical properties of circuit boards after fabrication.

U.S. Pat. No. 3,640,765 which issued to R. DiStefano, et al, on Feb. 28, 1972, describes modifying sensitizing solution or activator solution with commercially available surfactants such as Triton X-102 or Triton N-57 to achieve plating selectivity between ceramic and resist. This, however, is not effective with metal/dielectric systems.

U.S. Pat. No. 3,443,988 which issued to J. McCormack, et al, on May 13, 1969, describes overlaying electroless nickel, cobalt, or polyalloys onto copper in an electronic circuitry pattern. Poison is added to modify the dielectric materials so that the catalytic activity can be decreased. A drawback to this procedure is that the poison compounds tend to be leached out after the dielectric is soaked in the plating bath for a certain period. A small trace amount of these poison compounds in the solution can terminate the electroless plating reaction. In addition, a trace amount of additives in the dielectric materials can dramatically change the dielectric's chemical, electrical, and mechanical properties.

U.S. Pat. No. 4,232,060 which issued to G. Mallory on Nov. 4, 1980, describes a procedure for formulating catalytic baths which form an adherent nickel or cobalt alloy film on the copper that was then overplated with electroless nickel. These baths are basically immersion baths using dimethylamine borane (DMAB) as a reducing agent. In principle, the activation energy for electroless nickel deposition with DMAB is lower than that for hypophosphite and thus some metals such as copper which are not catalytic in hypophosphite are possible to initiate plating reaction with DMAB baths. This approach, however, is not effective when the circuit density is high, and may also result in non-plating features.

None of these previous inventions solves the problem of selective electroless plating of an overcoat metal on a metal circuit with a minimum of time and expense. In addition, almost all fail to address the problem of current leakage on a plastic surface. The present invention provides a pre-treatment process which can be applied to a variety of technologies, including copper/dielectric material interface problems such as corrosion and interdiffusion.

SUMMARY OF THE INVENTION

An object of the present invention is to provide selective electroless plating of an overcoat metal on metal conductors.

An additional object of the present invention is a time and money efficient manufacturing process for the electroless overcoating of conductive metal circuits in the production of interconnect substrates or high density circuit boards.

A further object of the present invention is a procedure for simplifying high-density copper/polyimide interconnect fabrication procedures.

Another object of the present invention is to provide an overcoat metal on a copper conductor which serves as both a diffusion barrier to prevent copper diffusion into the dielectric and a protective layer to prevent water from the dielectric from corroding the copper.

Thus, in accomplishing the foregoing objects there is provided in accordance with one aspect of the present invention a method for the selective electroless plating of an overcoat metal on a metal conductor disposed on a dielectric surface of a substrate, comprising the sequential steps of activating the metal conductor to allow electroless plating thereon by dipping the substrate in an activator solution, deactivating the dielectric surface to prevent electroless plating thereon without deactivating the metal conductor by dipping the substrate in a deactivator acid solution, and plating an overcoat metal on the metal conductor by dipping the substrate in an electroless plating solution, wherein the overcoat metal plates on the metal conductor without plating on the dielectric surface.

Another feature of the present invention further includes removing carbonized film from the dielectric surface by applying a plasma discharge, and acid treating the metal conductor by dipping the substrate in a first acid solution in order to clean the surface of the metal conductor, prior to activating the metal conductor.

Specific embodiments of the present invention use an activator solution selected from the group consisting of palladium, platinum, and gold. The first acid can be an inorganic acid such as hydrochloric, sulfuric, phosphoric, or a mixture thereof. The first acid can also be a carboxylic acid such as formic, acetic, propionic, citric, or a mixture thereof. The second acid can be an aqueous or non-aqueous solution which may contain alcohols, ketones, or ethers.

In the preferred embodiment, an oxygen/argon or oxygen/helium/$SF_6$ gas is used in the plasma discharge.

The manner in which the above featured advantages and objects of the present invention will be more readily understood by reading the more particular description of the method in the following specification.

DETAILED DESCRIPTION OF PREFERRED EMBODIMENTS

The present invention describes a method for the selective electroless plating of an overcoat metal on a metal conductor disposed on a dielectric surface of a substrate. Suitable dielectrics include polymers (e.g. polyimide), ceramics, plastics, and silicon compounds (e.g. silicon nitride, silicon carbide, silicon oxide). Suitable metal conductors include copper, aluminum, and tungsten. The metal conductors may be in and aligned with the dielectric surface, or may protrude above the dielectric surface. For illustration purposes, copper metal conductors protruding above a polyimide surface of an electrical interconnect substrate shall be described herein.

In the event a carbonized film resides on the dielectric surface, it must be removed. A carbonized film may or may not be present on the dielectric surface depending on the dielectric material and the previous processing steps. A carbonized film will not normally form on silicon or ceramics. However, a carbonized film may form on a polymer or a plastic if a metal layer has been previously deposited thereon. For instance, as described in U.S. Pat. No. 4,810,332, a blanket adhesion layer of chrome is sputtered on the polyimide surface prior to depositing copper lines. After copper lines are deposited over the titanium, the titanium between the copper lines is etched off the polyimide surface. This leaves a carbonized film on the polyimide surface from deposition of the titanium.

One method for removing a carbonized film is by applying a wet chemical etchant. The wet chemical etchant can be a non-aqueous solvent such as hydrazine. Alternatively, the wet chemical etchant can be an aqueous alkaline solution such as NaOH.

Another method for removing a carbonized film is by applying a plasma discharge. A variety of plasma discharge conditions can be used. A suitable plasma gas is oxygen/argon. In one embodiment, a oxygen/helium/SF$_6$ gas in the proportion of 50/10/10 is used. The gas is introduced at a pressure of about 100 to 800 millitorr, the power is set to about 100 to 400 watts. The plasma discharge occurs for about 30 to 120 seconds. These parameters may vary according to the size and the system used. The point is to completely remove the conductive carbonized layer.

The removal of a carbonized film may leave contaminants on the copper. A plasma discharge from a chamber dedicated to polyimide is less likely to contaminate the copper than a chamber used for widely varying materials, particularly metals. Likewise, a wet chemical etchant may or may not leave contamination on the copper depending on the etchant used. Additionally, the formation of an oxide film on the copper would be considered a contaminant.

In the event the removal of the carbonized film leaves contaminants on the copper then it is necessary to remove the contaminants. This can be accomplished by acid treating the copper by dipping the substrate in a first acid solution in order to clean the surface of the copper. The first acid solution can be inorganic, such as hydrochloric acid, sulfuric acid, phosphoric acid, or mixtures thereof. Alternatively, the first acid solution can be organic, such as a carboxyl acid. Suitable carboxyl acids include formic acid, acetic acid, propionic acid, citric acid, or a mixture thereof. The preferred first acid solution is dilute hydrochloric acid. In some embodiments this first acid wash step can be omitted. This is usually not as efficient but will generally give adequate results. Preferably the substrate is rinsed in deionized water to remove the first acid before proceeding to the next step.

The forementioned steps may or may not be necessary. However, in accordance with the present invention, it is mandatory to perform the sequential steps of (1) activating the metal conductor to allow electroless plating thereon by dipping the substrate in an activator solution; (2) deactivating the dielectric surface to prevent electroless plating thereon without deactivating the metal conductor by dipping the substrate in a deactivator acid solution; and (3) plating an overcoat metal on the metal conductor by dipping the substrate in an electroless plating solution, wherein the overcoat metal plates on the metal conductor without plating on the dielectric surface.

Therefore, the substrate is dipped in an activator solution which activates the copper to allow electroless plating thereon. Suitable activator solutions include compounds which contain palladium, gold, or platinum. In the preferred embodiment a palladium chloride solution is used. Palladium chloride is very effective and will not catalyze pretreated polyimide surfaces as long as no activator ions are retained on the polyimide after activation. If desired, the previously described plasma discharge could now be applied to facilitate the removal of carbonized film as well as decrease the number of palladium ions trapped on the polyimide surface.

After activating the copper but prior to electroless plating, it is necessary to deactivate the polyimide surface without deactivating the copper. For instance, after a palladium activation process, a small amount of palladium ions trapped on the polyimide surface can be reduced when contacted with an electroless plating solution. It is very difficult to remove all of the activator by dissolving in water or basic solutions. However, most of these metallic salts can be dissolved in acidic solutions. This is accomplished by dipping the substrate in a deactivator (or second) acid solution. The deactivator acid solution can be aqueous or non-aqueous. Suitable deactivator acid solutions include hydrochloric acid, acid, and carboxyl acids. Suitable carboxyl acids include acetic acid, formic acid, citric acid, propionic acid, or mixtures thereof. Furthermore, the deactivator acid solution can be an alcohol-based, ketone-based, or ether-based solution. Additionally, the deactivator acid solution can be based on ethanol, methanol, propanol, acetone, or ethyl ether. These deactivator solutions are very effective, for instance, in removing the palladium ions trapped on polyimide surfaces. A preferred deactivator solution is dilute hydrochloric acid. A non-aqueous deactivator acid would be preferred for copper conductors with high aspect ratios and/or sharp edges. Preferably the substrate is rinsed in deionized water to remove the deactivator solution before proceeding to the next step.

The final step of the present invention is plating an overcoat metal on the copper by dipping the substrate in an electroless plating solution so that the overcoat metal plates on the metal conductor without plating on the dielectric surface. A variety of overcoat metals can be used, including nickel, cobalt, nickel alloys, and cobalt alloys. Suitable nickel alloys include nickel/phosphorus, nickel/boron, nickel/cobalt, and the like. The overcoat metal can also be platinum, silver, or gold.

The preferred overcoat metal is nickel. The advantages of electroless nickel is that it is simpler to process and it has an elegant ability to deposit a durable overcoat to any micro-areas where copper needs to be protected. An important extent of this advantage is that all wafers in the interconnect process can be overcoated at one processing time. This means there would be no need to mount the wafer on a plating rack and no need to contact the wafer with a power supply. This dramatically improves the processing throughput.

In the nickel plating solution, either nickel sulfate or nickel chloride is acceptable. A high nickel concentration gives a faster plating rate but the bath's stability is reduced. The amount of chelating agents or ligands needed depends not only on the nickel concentration, but also on their chemical structure, functionality and equivalent weight. Most of the chelating agents used in electroless nickel plating solutions are hydroxy organic acids, which form one or more water soluble nickel ring complexes. These complexes are added to minimize the free nickel ion concentration. This increases bath stability while at the same time retaining a reasonable plating rate. Generally, the higher the complex agent concentration, the slower the plating rate.

Because hydrogen ions are a byproduct of nickel reduction, the pH of the bath and its plating rate decreases continuously. This is addressed by having the solution buffered as previously described. The most effective compounds are the sodium or potassium salts of mono and dibasic organic acids.

Small amounts of stabilizers can be added to the nickel bath to inhibit the palladium bath's spontaneous decomposition during plating. However, only a trace (less than one ppm) can be used. Larger amounts will cause nonplating or even poisoning of the bath. Thiourea and its derivatives, and heavy metals such as lead are common and effective stabilizers.

In the present invention, it was found that the combination of plasma treatment and wet chemistry cleaning was very effective. Under certain plasma conditions, the polymer surface can be made hydrophobic. This lowers the adherent coefficient of reactants on the plastic surface. Treating such hydrophobic surface with mild wet chemical cleaning is also key to elimination of unwanted deposition of metals on plastic materials.

EXAMPLE

An example of the preparation of an selective electroless plating of a nickel overcoat on a copper conductor disposed on a polyimide surface is now described.

The plasma discharge treatment was carried out in a mixture of oxygen and halocarbon environment. The reactor and related equipment were commercially purchased from Lam Research of Freemont, California. Typical parameters used were an RF power of 400 watts, a gas pressure of 800 millitorr, an O flow rate of about 50 sccm, an $SF_6$ flow rate of about 10 sccm, and a He flow rate of about 10 sccm.

A copper activation solution of dilute palladium chloride of approximately 0.1g of palladium chloride and 5 cc's of hydrochloric acid per liter of water was used. The dipping time was 10 seconds.

The first and second acid wash solutions were prepared as dilute acidic solutions of hydrochloric acid, sulfuric acid, formic acid, acetic acid and citric acid. The specific concentrations which were tested were 5%, 10%, 15%, 20% and 50% in volume of each acid. The dipping time was 5 minutes.

Nickel electroless plating solutions which are commercially available were used. These include Enplate NI-424 of Enthone or Duposit 84 of Shipley.

The results of these electroplating experiments are shown in Table 1.

TABLE 1

| SAMPLE | PLASMA | 1ST ACID | ACTIVATOR | 2ND ACID | RESULTS |
|--------|--------|----------|-----------|----------|---------|
| A | NO | NO | NO | NO | NO PLATING |
| B | NO | NO | YES | NO | SHORT |
| C | YES | NO | YES | NO | SHORT |
| D | YES | YES | YES | NO | SHORT |
| E | YES | YES | YES | YES | EXCELLENT |
| F | NO | YES | YES | YES | SHORT |
| G | YES | NO | YES | YES | GOOD |

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A method for electrolessly plating an overcoat metal on a metal conductor disposed on a dielectric surface of a substrate, comprising the following steps in the sequence set forth:
   activating the metal conductor to allow electroless plating thereon by dipping the substrate in an activator solution;
   deactivating the dielectric surface to prevent electroless plating thereon without deactivating the metal conductor by dipping the substrate in a deactivator acid solution; and
   plating an overcoat metal on the metal conductor by dipping the substrate in an electroless plating solution, wherein the overcoat metal plates on the metal conductor without plating on the dielectric surface.

2. The method of claim 1, wherein the activator solution is a compound that contains palladium, gold, or platinum.

3. The method of claim 1, wherein the deactivator acid solution is aqueous.

4. The method of claim 1, wherein the deactivator acid solution is non-aqueous.

5. The method of claim 1, wherein the deactivator acid solution is hydrochloric acid.

6. The method of claim 1, wherein the deactivator acid is a carboxyl acid.

7. The method of claim 6, wherein the carboxyl acid is selected from the group consisting of acetic acid, formic acid, citric acid, propionic acid, and mixtures thereof.

8. The method of claim 1, wherein the deactivator acid solution is an alcohol-based, ketone-based, or ether-based solution.

9. The method of claim 1, wherein the deactivator acid solution is based on liquid selected from the group consisting of ethanol, methanol, propanol, acetone, and ethyl ether.

10. The method of claim 1, wherein the overcoat metal is selected from the group consisting of nickel, cobalt, nickel alloys, and cobalt alloys.

11. The method of claim 1, wherein the overcoat metal is selected from the group consisting of nickel, cobalt, nickel/phosphorus, nickel/boron, and nickel/cobalt.

12. The method of claim 1, wherein the overcoat metal is selected from the group consisting of platinum, silver, and gold.

13. The method of claim 1, wherein the dielectric is a polymer, a ceramic, or a silicon compound.

14. The method of claim 1, wherein the dielectric is polyimide.

15. The method of claim 1 wherein the dielectric is plastic.

16. The method of claim 1, wherein the conductor metal is selected from the group consisting of copper, aluminum, and tungsten.

17. The method of claim 1, wherein
   the conductor metal is copper,
   the dielectric is a polymer or a plastic,
   the activator solution contains palladium,
   the deactivator acid solution removes palladium ions trapped on the dielectric surface, and
   the overcoat metal contains nickel.

18. A method for selectively depositing an overcoat metal on a metal conductor disposed on a dielectric surface of a substrate, comprising the following steps in the sequence set forth:
   removing carbonized film from the dielectric surface;
   activating the metal conductor to allow electroless plating thereon by dipping the substrate in a metal activator solution;
   deactivating the dielectric surface to prevent electroless plating thereon without deactivating the metal conductor by dipping the substrate in a deactivator acid solution; and plating an overcoat metal on the metal conductor by dipping the substrate in an electroless plating solution, wherein the overcoat metal coats the metal conductor without plating the dielectric surface.

19. The method of claim 18, wherein the carbonized film is removed by a wet chemical etchant.

20. The method of claim 19, wherein the wet chemical etchant is a non-aqueous solvent.

21. The method of claim 20, wherein the nonaqueous solvent is hydrazine.

22. The method of claim 18, wherein the wet chemical etchant is an aqueous alkaline solution.

23. The method of claim 22, wherein the aqueous alkaline solution in NaOH.

24. The method of claim 18, wherein the carbonized film is removed by applying a plasma discharge.

25. The method of claim 24, wherein the plasma discharge includes an oxygen/argon gas.

26. The method of claim 24, wherein the plasma discharge includes an oxygen/helium/$SF_6$ gas.

27. The method of claim 26, wherein the plasma discharge includes an oxygen/helium/$SF_6$ gas in the proportions of about 50/10/10, a pressure of about 100 to millitorr, a RF power of about 100 to 400 watts, and the plasma discharge occurs for about 30 to 120 seconds.

28. The method of claim 18, further comprising acid treating the metal conductor, between the steps of removing the carbonized film and activating the metal conductor, by dipping the substrate in a first acid solution, in order to clean the surface of the metal conductor.

29. The method of claim 18, wherein the conductor metal is selected from the group consisting of copper, aluminum, and tungsten.

30. The method of claim 18, wherein the dielectric is a polymer or a plastic.

31. A method for electrolessly plating an overcoat metal on a metal conductor disposed on a dielectric surface of a substrate, comprising the following steps in the sequence set forth:
removing carbonized film from the dielectric surface by applying a plasma discharge;
acid treating the metal conductor by dipping the substrate in a first acid solution in order to clean the surface of the metal conductor;
activating the metal conductor to allow electroless plating thereon by dipping the substrate in a metal activator solution;
deactivating the dielectric surface to prevent electroless plating thereon without deactivating the metal conductor by dipping the substrate in a second acid solution; and
plating an overcoat metal on the metal conductor by dipping the substrate in an electroless plating solution, wherein the overcoat metal plates on and coats the metal conductor without plating on the dielectric surface.

32. The method of claim 31, wherein the first acid solution is inorganic.

33. The method of claim 32, wherein the first acid solution is selected from the group consisting of hydrochloric acid, sulfuric acid, phosphoric acid, and mixtures thereof.

34. The method of claim 31, wherein the first acid solution is organic.

35. The method of claim 34, wherein the first acid solution is a carboxyl acid.

36. The method of claim 35, wherein the carboxyl acid is selected from the group consisting of formic acid, acetic acid, propionic acid, citric acid, and a mixture thereof.

37. The method of claim 31, wherein the first and second acid solutions are hydrochloric acid.

38. The method of claim 31, further comprising rinsing the first acid solution off the substrate before activating the metal conductor.

39. The method of claim 31, further comprising rinsing the second acid solution off the substrate before plating the overcoat metal.

40. The method of claim 31, wherein the overcoat metal is selected from the group consisting of nickel, cobalt, nickel alloys, and cobalt alloys.

41. The method of claim 31, wherein the activator solution is a compound that contains palladium, gold, or platinum.

42. The method of claim 31, wherein the dielectric is a polymer or a plastic.

43. The method of claim 31, wherein the conductor metal is selected from the group consisting of copper, aluminum, and tungsten 44. The method of claim 31, wherein
the conductor metal is copper,
the dielectric is a polymer or a plastic,
the activator solution contains palladium,
the second acid solution removes palladium ions trapped on the dielectric surface, and
the overcoat metal contains nickel.

* * * * *

UNITED STATES PATENT AND TRADEMARK OFFICE
CERTIFICATE OF CORRECTION

PATENT NO. : 5,167,992
DATED : December 1, 1992
INVENTOR(S) : Lin et al

It is certified that error appears in the above-indentified patent and that said Letters Patent is hereby corrected as shown below:

Column 1, line 23, change "mulitlayer" to -- multilayer --.

Column 2, line 41, insert -- issued -- after "which".

Column 2, line 42, insert -- plasma -- before "treatment".

Column 2, line 50, change "on to" to -- onto --.

Column 2, line 63, change "to" to -- so --.

Column 6, line 6, delete "acid," before "and".

Signed and Sealed this

Twenty-sixth Day of October, 1993

Attest:

BRUCE LEHMAN

*Attesting Officer*  *Commissioner of Patents and Trademarks*